Sept. 2, 1952 J. F. BARRY 2,608,745

SOLDERING APPARATUS FOR PIEZOELECTRIC CRYSTALS

Filed June 30, 1948

INVENTOR
J. F. BARRY
BY J. MacDonald
ATTORNEY

Patented Sept. 2, 1952

2,608,745

UNITED STATES PATENT OFFICE 2,608,745

SOLDERING APPARATUS FOR PIEZO-ELECTRIC CRYSTALS

Joseph F. Barry, Summit, N. J., assignor to Bell Telephone Laboratories, Incorporated, New York, N. Y., a corporation of New York Application June 30, 1948, Serial No. 36,038

6 Claims. (Cl. 29—25.35)

This invention relates to piezoelectric crystal apparatus and particularly to soldering apparatus and methods suitable for employment in the manufacture of piezoelectric crystal units.

The object of the invention is to provide an improved apparatus and an improved method for accurately securing the electrode wires of a piezoelectric element to wires mounted in and extending from a support.

A feature of the invention resides in an adjustable holding device for holding parts of the crystal unit while work is being done to the crystal unit.

Another feature resides in the combination of an electrical oscillator with the adjustable holding device for the crystal.

Another feature resides in a soldering tool.

In piezoelectric crystal units now in rather wide use in electrical oscillation generator systems, filter systems and electromechanical vibratory systems, the crystal element often comprises a plate-like crystal with an electrode wire of relatively fine gauge secured to and extending directly outward from one flat face of the crystal and another electrode wire of relatively fine gauge secured to and extending directly outward from the other flat face of the crystal. The electrode wires are secured to wires extending from a support or base equipped with terminals for connecting the crystal unit into an electrical circuit. When the crystal unit is connected into a suitable electrical circuit and is electrically energized at a required frequency the crystal element should vibrate at a predetermined frequency for maximum efficiency of performance. Any interference with the freedom of vibration of the crystal element will reduce the efficiency of operation of the piezoelectric crystal unit.

In order that a piezoelectric crystal element in a piezoelectric crystal unit may vibrate as freely as possible and with a minimum of interference from the means provided to support the crystal element it is necessary to make the supporting structure for the piezoelectric element have a mechanical impedance of as low order as possible and still have sufficient strength and rigidity that the crystal unit will not change its frequency characteristic of operation as an oscillator when the crystal unit is subjected to mechanical shock or vibration in ordinary service, transportation or handling.

Piezoelectric crystal units are now being made in various sizes and forms and in the case of some sizes and forms the demand is such that the crystal units are being produced under so-called mass production conditions.

Figures 1, 2, 3:
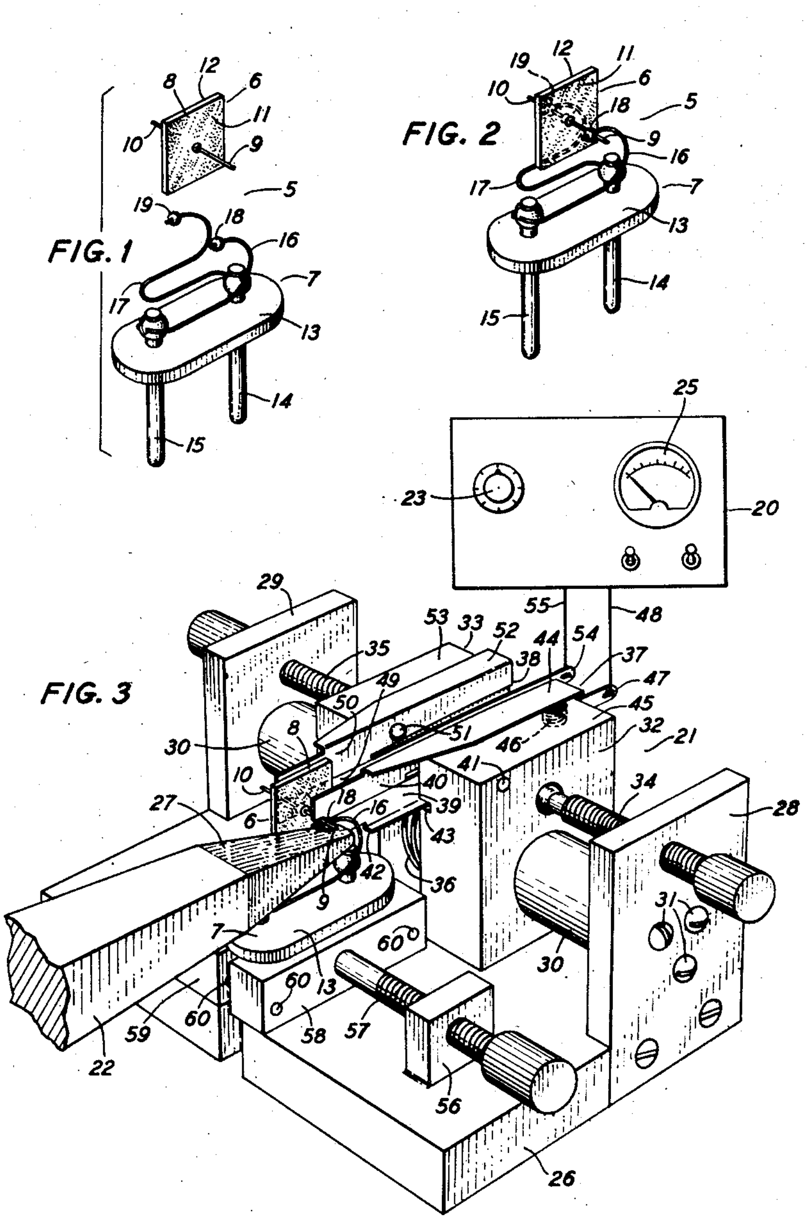
Fig. 1 is a view in perspective of a piezoelectric crystal element and a support, the piezoelectric crystal element being equipped with electrode wires to be electrically connected to wires extending from the support.
Fig. 2 is a view in perspective of the crystal element and support shown in Fig. 1 after the wires of the parts have been electrically connected as required.
Fig. 3 is a view in perspective of the adjustable holding device and the soldering tool constructed and arranged according to the invention.

The crystal unit 5 shown partly assembled in Fig. 1 and completely assembled in Fig. 2 comprises a piezoelectric element 6 and a support 7. The piezoelectric element 6 is a sheet 8 of quartz or other material having piezoelectric properties and is equipped with two electrode wires 9 and 10 which are secured to and in electrical connection with the sheet 8, one electrode wire 9 extending directly outward from one flat face of the crystal 8 and from a coating 11 of metal thereon and the other electrode wire 10 extending directly outward from an opposite flat face of the crystal 8 and from a coating 12 of metal on that face of the crystal. The support 7 comprises a body 13 of insulating material in which are supported spaced pin-type terminals 14 and 15. Flexible spring wires 16 and 17 are secured to the respective pin-type terminals 14 and 15 and extend upwardly in bowed formation as shown to engage the respective electrode wires 9 and 10 on the piezoelectric element 6. The flexible spring wires 16 and 17 as shown in Fig. 2 are electrically connected to the respective electrode wires 9 and 10 by solder balls 18 and 19 respectively.

In piezoelectric crystal units of the type shown in Fig. 2 the electrode wires 9 and 10 are in connection with the crystal sheet 8 at nodes or minimum points of motion of the crystal. The crystal can be, for example, a quartz crystal sheet of the face shear mode type having its node or point of minimum motion at or near the center of the crystal. The electrode wires 9 and 10 have nodal or minimum points of motion and each solder ball 18 or 19 is applied at or near a nodal point on the electrode wire 9 or 10, as the case may be, in order that the wire mounting means for the crystal sheet 8 will present only a very low order of damping to the crystal 8 when the piezoelectric crystal unit 5 is electrically energized.

It would seem that when one satisfactory piezoelectric crystal unit 5 of the type shown in Fig. 2 had been produced and it was desired to make a large quantity of piezoelectric crystal units of this type and all having the same electrical operational value it would be only necessary to cut the required number of crystals to the same size, provide thereon electrode wires all of the same gauge and about the same length and solder connect the spring wires of the supports to the electrode wires of the crystals an equal distance from the face of each crystal as in the first produced satisfactory piezoelectric units. When this procedure is followed, however, it very often happens that the crystal units produced are not alike in electrical value and that the percentage of rejection on inspection is very high. This is particularly true in the case of very small dimension piezoelectric crystal units.

I have found that the differences in electrical values of supposed alike piezoelectric crystal units is sometimes due to slight differences in size of the piezoelectric crystal element, slight differences in size or composition of the electrode wires and slight differences in the point of securement of an electrode wire to a spring wire in the support. As a general rule the smaller the crystal the greater it is affected by a slight change in the structure or arrangement of the supporting means.

In manufacturing piezoelectric crystal units in accordance with the present invention each crystal element is electrically energized to determine an exact point on each electrode wire at which the electrode wire and a spring wire of a support should be connected to interfere as little as possible in the operation of the crystal element. The electrode wire and the spring wire are then connected at the required point by a ball of solder. Under this condition each piezoelectric crystal element is accurately mounted on the wires of the support and a good crystal element is not improperly mounted in a support or rendered unfit for the service required.

As shown in Fig. 3 I have provided apparatus for electrically testing a crystal element to determine a required point on an electrode wire at which a wire of a support should be connected and a soldering device to connect the electrode wire and the wire of the support by means of a ball of solder. The apparatus comprises an electrical testing unit 20, the adjustable holding device 21 for adjustably holding a piezoelectric crystal element and the soldering tool 22 for heating the ball of solder to form an electrical connection between an electrode wire of the crystal element and a spring wire of a support.

The electrical testing unit 20 is a conventional electrical testing apparatus operable to be electrically connected to a piezoelectric crystal element and to operate the crystal as required for instance as an electrical oscillator. The electrical testing unit 20 is equipped with frequency control knob 23 and with a meter indicator 25 by means of which indications are given of the operation of a crystal element while the crystal element is being energized.

The adjustable holding device 21 comprises a base 26 and spaced upright end portions 28 and 29 providing end supports for a cylindrical bar 30, ends of which are secured to the end portions 28 and 29 by means of screws 31. The cylindrical bar 30 extends in horizontal spaced relation with the base 26 and provides a support for apertured and movable blocks 32 and 33 which can be moved toward each other by means of the respective adjustment screws 34 and 35 extending through internally threaded apertures in the respective end portions 28 and 29 and into engagement with the respective movable insulating blocks 32 and 33. The adjustment screws can be constructed to operate in the nature of micrometers. A helical spring 36 is supported on the cylindrical bar 30 and disposed between the movable blocks 32 and 33 to move the movable blocks 32 and 33 away from each other when such action is permitted by operation of the adjustment screws 34 and 35. Each block 32 and 33 forms a movable support for a pair of jaws constructed and arranged to grip an electrode wire on a crystal element 6 as shown in Fig. 3. The block 32 carries the pair of jaws 37 and the block 33 carries the pair of jaws 38.

The pair of jaws 37 comprises a lower jaw 39 fixedly secured in the block 32 and an upper jaw 40 pivotally secured by means of a pin 41 in the block 32. Each jaw 39 and 40 is L-shaped in cross-section so that a flange 42 on the jaw 39 extends into a slot 43 formed in the inner face of the block 32 and the flange 44 on the jaw 40 extends over and in spaced relation with the top surface 45 of the block 32. A helical spring 46 disposed between the under surface of the flange 44 and the top surface 45 of the block 32 operates to urge the forward portion of the upper jaw 40 toward the forward portion of the lower jaw 39. The rear portion of the lower jaw 39 is formed into an apertured terminal tab portion 47 connected by means of a wire 48 in Fig. 3 to the electrical testing unit 20. The pair of jaws 38 comprises a lower jaw 49 fixedly secured in the block 32 and an upper jaw 50 pivotally secured by means of a pin 51 in the block 33. The flange 52 on the upper jaw 50 extends over and in spaced relation with the top surface 53 of the block 33, a helical spring, like the spring 46, being disposed between the flange 52 and the top surface of the block 33 and operating to urge the forward end portion of the upper jaw 50 toward the forward portion of the lower jaw 49. The rear portion of the lower jaw 49 is formed into an apertured terminal tab portion 54 which is in electrical connection through the conductor 55 with the electrical testing device 20. It will be seen as shown in Fig. 3 that one electrode wire 9 of the crystal element 6 can be placed between the forward end of the lower jaw 39 and the forward end of the upper jaw 40, the spring 46 operating to hold the upper jaw 40 pressed down against the electrode wire 9. By pressing down on the upper jaw 40 rearwardly of the pin 41 and about over the position of the spring 46 the upper jaw 40 can be lifted off the electrode wire 9. Under this condition the jaws 39 and 40 can be moved along the electrode wire 9 either toward or away from the crystal sheet 8 by suitable manipulation of the adjusting screw 34 operating in one direction against the pressure of the spring 36.

The electrode wire 10 of the piezoelectric element in Fig. 3 is gripped by the pair of jaws 38, the forward portion of the upper jaw 50 being spring urged to bear down on the electrode wire 10 which rests on the lower jaw 49. The jaws 49 and 50 can be moved lengthwise along the electrode wire 10 by pressing down on the rear portion of the upper jaw 50 and by suitable manipulation of the adjusting screw 35.

Extending upward from the base 26 is an apertured and internally threaded wall 56 supporting a male threaded rotatable shaft 57 operable to move a movable vise jaw 58 relative to a fixed vise jaw 59 supported on the base 26. The movable vise jaw 58 is apertured to accommodate guide rods 60—60 mounted in and extending from the fixed vise jaw 59. The vise jaws 58 and 59 are operable to hold the support 7 in place and in required position relative to the piezoelectric crystal element 6 while the electrode wires 9 and 10 of the piezoelectric crystal element 6 are being connected by means of the solder balls 18 and 19 to the respective spring wires 16 and 17 of the support 7.

The soldering tool 22 is manually movable and is in the nature of an electrically heated soldering iron and can be brought into engagement with a solder ball 18 or 19 on the respective wires 16 and 17 to heat the solder ball. The work-head portion of the soldering tool 22 should be non-wetting with regard to solder so that when the ball of solder is heated by means of the soldering tool 22 the solder will not adhere to the soldering tool 22. To make the soldering tool non-wetting with regard to solder, the work-head can be a copper work-head having an outer plating 27 of chromium. In some cases a non-wetting work-head is obtained by making the work-head of aluminum-bronze composition.

In some cases the spring wires 16 and 17 are equipped with the respective solder balls 18 and 19 preparatory to the forming of the electrical connections between the electrode wires 9 and 10 of the crystal and the wires 16 and 17 of the support. In Fig. 3 the spring wires 16 and 17 are equipped with the respective solder balls 18 and 19 and the soldering tool 22 is being applied to the solder ball 18 to soften the solder ball 18 sufficient to make the solder ball 18 secure the electrode wire 9 to the spring wire 16.

Figure 4:
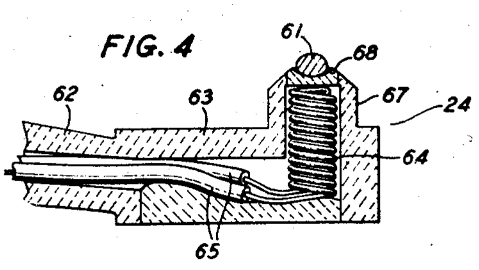
Fig. 4 is a side view, partly in section, of a modification of the soldering tool.

In the event that the spring wires 16 and 17 are not initially equipped with the respective solder balls 18 and 19 the soldering tool 24 shown in Fig. 4 can be used in solder connecting an electrode wire of the crystal element to a spring wire of the support.

The soldering tool 24 is manually operable to carry a pellet 61 of solder to a required point and is also operable to melt the pellet 61 so that the solder can pass around and enclose a portion of an electrode wire on the crystal element and a portion of a spring wire on the support 7. As shown in Fig. 4 the soldering tool 24 comprises a hollow handle portion 62 terminating at one end in a hollow head portion 63 in which is housed an electrical heating coil 64 that can be supplied with operating current by way of the wires 65 extended through the hollow handle portion 62. The head portion 63 at least should be made of good heat conducting and electrical insulating material. A tower-like portion 67 extends upwardly from the head portion 63 and accommodates part of the heating coil 64. The top of the tower-like portion 67 supports a recessed receptacle 68 made of good heat conducting but fire resisting cement and non-wettable by solder in which the pellet 61 of solder can rest until heated and applied to the wires to be connected.

In practicing this invention in the manufacture of piezoelectric units the piezoelectric crystal element 6 with its electrode wires 9 and 10 is placed between the pairs of jaws 37 and 38 of the holding device 21 and so that the electrode wire 9 rests on the lower jaw 39 of the pair 37 and the electrode wire 10 rests on the lower jaw 49 of the pair 38. The upper jaw 40 of the pair 37 by reason of the spring 46 presses the electrode wire 9 against the upper edge of the lower jaw 39. The upper jaw 50 of the pair 38 presses the electrode wire 10 against the upper edge of the lower jaw 49. Since the apertured tab portions 47 and 54 of the respective lower jaws 39 and 49 are in electrical connection through the respective wires 48 and 55 with the testing apparatus 20 the piezoelectric crystal element 6 is in electrical connection with the testing apparatus 20 which can then be operated to test the piezoelectric crystal element 6. A support 7 is placed so that the terminals 14 and 15 extend down between the vise jaws 58 and 59 and the body 13 rests on the upper surfaces of the vise jaws 58 and 59. The support 7 is positioned so that the spring wire 16 extends into engagement with the electrode wire 9 and the spring wire 17 extends into engagement with the electrode wire 10 as shown in Fig. 3. While the piezoelectric crystal element 6 is in electrical operation the jaws 39 and 40 can be moved along the electrode wire 9 by simply pressing on the flange 44 of the jaw 40 to raise the forward end of the jaw 40 from the electrode wire 9 and by turning the adjustment screw 34 in the required direction to cause the block 32 to move along the cylindrical bar 30. The jaws 49 and 50 can also be moved along the electrode wire 10 by simply pressing on the flange 52 of the jaw 50 to raise the forward end of the jaw 50 from the electrode wire 10 and by turning the adjustment screw 35 in the required direction to cause the block 33 to move along the cylindrical bar 30. The pairs of jaws 37 and 38 can therefore be separately adjusted along the respective electrode wires 9 and 10 of the piezoelectric crystal element 6 while the crystal element 6 is in electrical operation. By watching the indicator 25 while the pairs of jaws 37 and 38 are moved along the respective electrode wires 9 and 10 to different points the operator can determine at which points the electrode wires can be fastened to a support and have maximum efficiency of operation of the piezoelectric crystal element 6. When the operator determines the required points for connection of the electrode wires 9 and 10 to the respective spring wires 16 and 17 the operator melts solder to the electrode wire of the piezoelectric crystal element 6 and the corresponding spring wire of the support 7 at the point where the electrode wire and the spring wire should be joined and solder connects the two wires together, the solder joint being in effect a ball of solder of predetermined size.

The soldering tool 22 or the soldering tool 24 can readily be used in solder connecting an electrode wire of the piezoelectric crystal element 6 to a spring wire of the support 7. In using the soldering tool 24 for this purpose and assuming that the spring wires 16 and 17 are not initially equipped with the respective solder balls 18 and 19 and that the operator has brought the jaws 39 and 40 of the adjustable holding device 21 to the required point on the electrode wire 9 at which the spring wire 16 should be connected the operator places a solder pellet 61 of predetermined size and form in the receptacle 68 of the soldering tool 24, operates the soldering tool 24 to bring the pellet 61 to a molten condition, brings the molten pellet of solder by means of the soldering tool 24 to the exact point required on the electrode wire 9 and manually moves the spring wire 16 to extend into the molten pellet of solder. The soldering tool 24 is then operated to let the solder cool and set at the required point of connection of the electrode wire 9 to the spring wire 16. In performing the soldering operation the operator by suitable manipulation of the adjusting screw 34 can move the jaws 39 and 40 inward toward the crystal sheet 8 a sufficient distance from the desired soldering point to allow the solder pellet to be brought by means of the soldering tool 24 to the exact point at which the solder connection should be made. It will be understood that the soldering tool 24 can be supplied with another solder pellet 61 and then moved over to the other side of the crystal element 6 to solder connect the electrode wire 10 to the spring wire 17 of the support 7 as required.

Since my invention provides for electrically testing each crystal and determining at which point each electrode wire should be solder connected to a supporting wire and then solder connecting the wires at the exact required point the percentage of rejection in manufacturing piezoelectric crystal units of the type shown is much lower than formerly experienced in making piezoelectric crystal units of the type shown and described.

What is claimed is:

1. Apparatus for accurately securing a piezoelectric crystal element equipped with electrode wires to spaced wires on a support comprising a holding device to hold the piezoelectric crystal element and said support, a laterally movable pair of jaw members for and operable to engage each electrode wire on the piezoelectric crystal element, a movable supporting means for each pair of jaw members, adjustment and measurement means individual to each of said movable supporting means for moving each pair of jaw members lengthwise of the electrode wires of the piezoelectric crystal element, an electrical testing apparatus operable to electrically energize and test the piezoelectric crystal element and electrically connected to the electrode wires of the piezoelectric crystal element through said jaw members and a soldering means for soldering the electrode wires of the piezoelectric crystal to the wires of the support at the points of engagement of said jaw members with the electrode wires of the piezoelectric crystal element.

2. Apparatus for accurately securing a piezoelectric crystal element equipped with electrode wires to spaced wires on a support comprising a holding device to hold the piezoelectric crystal element and said support in position for solder connecting the electrode wires on the piezoelectric crystal element to the required spaced wires on the support, a plurality of pairs of movably supported and laterally movable jaw members, a movably supported block member supporting each pair of jaw members, adjusting means individual to each block member to move said block members relative to each other to bring said pairs of jaw members to required places on the electrode wires of the piezoelectric crystal element and a soldering tool comprising a heated receptacle to carry a heated pellet of solder to a required point to solder connect an electrode wire on the piezoelectric crystal to a wire on the support.

3. A holding device for holding an electrical element equipped with electrode wires comprising a base, spaced walls supported on said base, a bar secured to and extending between said walls, apertured block members movably supported on said bar and operable to move relative to each other along said bar, individual adjustment screws for each of said block members to move said block members along said bar and a pair of jaw members supported on each of said block members and operable to selectively engage portions of the electrode wires on the electrical element.

4. A method of mounting a piezoelectric crystal equipped with electrode wires on wires of a support comprising electrically operating the crystal while selectively gripping the electrode wires at different points to determine the most advantageous points at which the electrode wires should be attached to the wires of the support, shifting the grips on the wires to points offset from the most advantageous points above mentioned and then, while still gripping the electrode wires, connecting each electrode wire to its corresponding wire on the support at the required most advantageous connecting point.

5. A method of mounting a piezoelectric crystal element equipped with electrode wires on wires of a support comprising electrically operating the crystal element while selectively gripping each electrode wire at different points in succession to determine the most advantageous points at which the electrode wires should be attached to the wires of the support, shifting the grips on the wires to points offset from the most advantageous points above mentioned and then, while still gripping the electrode wires, connecting each electrode wire to its corresponding wire on the support, at the point required, by means of a ball of solder.

6. Apparatus for accurately securing a crystal element equipped with electrode wires to spaced wires on a support, comprising the combination of pairs of jaws operable to grip the electrode wires, means for moving said pairs of jaws longitudinally along said electrode wires, and electrical means to electrically energize the crystal element, said electrical means being electrically connected to said crystal element through said pairs of jaws whereby said jaws may grip the electrode wires at the most advantageous points for connection to the spaced wires.

JOSEPH F. BARRY.

REFERENCES CITED

The following references are of record in the file of this patent:

UNITED STATES PATENTS

| Number | Name | Date |
|---|---|---|
| 2,308,606 | Ingerson | Jan. 19, 1943 |
| 2,347,397 | Crist | Apr. 25, 1944 |
| 2,364,689 | Brooks | Dec. 12, 1944 |
| 2,365,273 | Johansson | Dec. 19, 1944 |
| 2,371,613 | Fair | Mar. 20, 1945 |
| 2,404,730 | Johansson | July 23, 1946 |
| 2,426,650 | Sivian | Sept. 2, 1947 |